(12) United States Patent
Xiao (10) Patent No.: US 9,721,846 B1
(45) Date of Patent: Aug. 1, 2017

(54) HYBRID INTEGRATION FABRICATION OF NANOWIRE GATE-ALL-AROUND GE PFET AND POLYGONAL III-V PFET CMOS DEVICE

(71) Applicant: Zing Semiconductor Corporation, Shanghai (CN)

(72) Inventor: Deyuan Xiao, Shanghai (CN)

(73) Assignee: ZING SEMICONDUCTOR CORPORATION, Shanghai (CN)

( * ) Notice: Subject to any disclaimer, the term of this patent is extended or adjusted under 35 U.S.C. 154(b) by 0 days.

(21) Appl. No.: 15/157,421

(22) Filed: May 18, 2016

(30) Foreign Application Priority Data

Mar. 16, 2016 (CN) .......................... 2016 1 0150107

(51) Int. Cl.
| | |
|---|---|
| H01L 21/283 | (2006.01) |
| H01L 29/66 | (2006.01) |
| H01L 21/8238 | (2006.01) |
| H01L 29/06 | (2006.01) |
| H01L 29/423 | (2006.01) |
| H01L 29/49 | (2006.01) |
| H01L 29/51 | (2006.01) |
| H01L 29/786 | (2006.01) |
| H01L 27/092 | (2006.01) |
| H01L 27/12 | (2006.01) |
| H01L 21/84 | (2006.01) |

(52) U.S. Cl.
CPC ............ *H01L 21/823807* (2013.01); *H01L 21/823828* (2013.01); *H01L 21/823857* (2013.01); *H01L 21/84* (2013.01); *H01L 27/0922* (2013.01); *H01L 27/1207* (2013.01); *H01L 29/0673* (2013.01); *H01L 29/42392* (2013.01); *H01L 29/4908* (2013.01); *H01L 29/517* (2013.01); *H01L 29/78681* (2013.01); *H01L 29/78684* (2013.01); *H01L 29/78696* (2013.01)

(58) Field of Classification Search
CPC .................................................. H01L 21/283
See application file for complete search history.

(56) References Cited

U.S. PATENT DOCUMENTS

| | | | | |
|---|---|---|---|---|
| 8,183,104 | B2 * | 5/2012 | Hobbs ................. | B82Y 10/00 257/E29.245 |
| 2009/0170251 | A1 * | 7/2009 | Jin ..................... | B82Y 10/00 438/197 |
| 2010/0187503 | A1 * | 7/2010 | Moriyama ............ | B82Y 10/00 257/24 |
| 2014/0151705 | A1 * | 6/2014 | Xiao ................... | B82Y 10/00 257/64 |
| 2014/0273423 | A1 * | 9/2014 | Fronheiser ......... | H01L 29/42392 438/585 |
| 2014/0326952 | A1 * | 11/2014 | Kuhn .................. | B82Y 10/00 257/24 |

(Continued)

*Primary Examiner* — Allen Parker
*Assistant Examiner* — Ismail Muse
(74) *Attorney, Agent, or Firm* — Kilpatrick Townsend & Stockton LLP (57) ABSTRACT

The present invention provides a method of manufacturing nanowire semiconductor device. In the active region of the PMOS the first nanowire is formed with high hole mobility and in the active region of the NMOS the second nanowire is formed with high electron mobility to achieve the objective of improving the performance of nanowire semiconductor device.

5 Claims, 7 Drawing Sheets

(56) References Cited

U.S. PATENT DOCUMENTS

| | | | |
|---|---|---|---|
| 2015/0104918 A1* | 4/2015 | Liu | H01L 29/42392 |
| | | | 438/283 |
| 2015/0340438 A1* | 11/2015 | Zhu | H01L 29/78648 |
| | | | 257/77 |
| 2016/0071931 A1* | 3/2016 | Cheng | H01L 21/0245 |
| | | | 257/329 |
| 2016/0268376 A1* | 9/2016 | Shih | H01L 29/0673 |
| 2016/0276431 A1* | 9/2016 | Wen | H01L 29/0673 |
| 2016/0284810 A1* | 9/2016 | Chang | H01L 29/42392 |
| 2016/0293733 A1* | 10/2016 | Leobandung | H01L 29/0673 |

* cited by examiner

HYBRID INTEGRATION FABRICATION OF NANOWIRE GATE-ALL-AROUND GE PFET AND POLYGONAL III-V PFET CMOS DEVICE

The present application claims the priority to Chinese Patent Applications No. 201610150107.3, filed with the Chinese State Intellectual Property Office on Mar. 16, 2016, which is incorporated herein by reference in its entirety.

TECHNICAL FIELD

The present invention relates to the field of semiconductor technology, in particular to a nanowire semiconductor device and its manufacturing method.

BACKGROUND

Over the past four decades, the development of the microelectronics industry has been consistently following the pace of Moore's Law to shrink the characteristic sizes of semiconductor devices. Currently, the physical size of the semiconductor devices has reached its limit, any further reduction of the physical size to improve performance is becoming extremely difficult.

To meet the challenge of size reduction and market demand, the design of new types of semiconductor devices have turned to the development of nanowire field effect transistor (NWFET). NWFET structure has a one-dimensional line channel. Due to the quantum confinement effect, the motion of carriers in the channel is restricted in specific energy levels, free from the disturbance of surface scattering and the channel transverse electric field. As a result, the carriers are transported in NWFET with significantly higher mobility. On the other hand, NWFET channel is smaller in size and usually designed with wrap around gate. The all-around gate enables the modulation of the channel from a plurality of directions, thereby enhancing the regulatory capacity of the gate to improve the threshold characteristics. Therefore, the short channel effect in NWFET can be very well suppressed, enabling further size reduction of the field effect transistor. Meanwhile, NWFET, owing to the fine channel size and the unique all-around gate design, allows easing the demand of shrinking the gate dielectric thickness, thereby reducing the gate leakage current. Consequently, NWFET is gaining increasing attention of researchers.

However, in reality, the performance of manufactured nanowire semiconductor devices remains relatively poor, cannot meet the market requirements. The challenge remains for people in the field of semiconductor manufacturing to further improve the performance of the nanowire semiconductor device to meet the technical performance and market demands.

SUMMARY

The main purpose of the present invention is to provide a method of fabrication of a nanowire semiconductor device to remedy the problem of poor performance of nanowire semiconductor device manufactured with prior art. The method of manufacturing a nanowire semiconductor device of the present invention comprising:

providing a substrate, said substrate including an active region NMOS and PMOS active region;

at first, a selective epitaxial growth process is performed to produce a first polygon structure nanowire in the active region of NMOS;

a second selective epitaxial growth process performed to form a polygon structure second nanowire in the PMOS active region;

removing a portion of the substrate through an etching process, such that the first of the nanowire is suspended above the substrate;

said first nanowire is treated with oxidation and annealing;

and sequentially forming a gate dielectric layer and a gate electrode layer on said substrate, first nanowire, and second nanowire.

Alternatively, in the method of manufacturing a nanowire semiconductor device, providing a substrate comprising an isolation structure formed on the substrate prior to performing the first selective epitaxial growth process to form a first polygon structure in the NMOS active region.

In the method of manufacturing a nanowire semiconductor device, a first selective epitaxial growth process is performed to form a first polygon structure nanowire in the active region of NMOS comprising:

forming a first patterned hard mask layer on the substrate and the isolation structure. The first hard mask layer has a first through hole and exposing a portion of the substrate of said first NMOS active region at the bottom of the through hole.

The first selective epitaxial growth process is to form a first polygonal structure nanowire on the exposed substrate of said first through hole and removing the first hard mask layer.

Alternatively, in the method of manufacturing a nanowire semiconductor device, a second selective epitaxial growth process is performed to form a second polygon structure nanowire in the active region of PMOS comprising:

forming a patterned second hard mask layer on the substrate, the isolation structure and the first nanowire, said second hard mask layer has a second via hole and the bottom of the second through hole exposing a portion of the substrate of the active region of PMOS; a recess is formed at the exposed substrate at the bottom of the second through hole by wet etching.

A second selective epitaxial growth process is performed to form a second nanowire of polygonal cross-section on said recess; and removing the second hard mask layer.

Alternatively, in the method of manufacturing a nanowire semiconductor device, the process of oxidation and annealing treatment of the first nanowire comprising:

thermal oxidation of said first nanowires; the oxide layer on the first nanowire surface is removed by wet etching process; and annealing the first nanowire in a hydrogen environment at high temperature.

Alternatively, in the method of manufacturing a nanowire semiconductor device, the material of the first nanowire and the second nanowire are group III-V semiconductor material. Alternatively, in the method of manufacturing a nanowire semiconductor device, the material of said first nanowire is germanium, the material of said second nanowire is indium gallium arsenide.

The present invention also provides a nanowire semiconductor device comprising:

a substrate, said substrate including active regions in PMOS and NMOS; forming a first nanowire in the active region of PMOS;

a second nanowire in the active region of NMOS;

surrounding completely said first nanowire and partially the second nanowire with gate dielectric layer and gate electrode layer.

Alternatively, in said nanowire semiconductor device, the length of the first nanowire is in the range of between 2 nm to 50 nm, the diameter of the first nanowire is in the range of between 2 nm to 5 nm.

Alternatively, in said semiconductor device, the first nanowire is germanium nanowire, the shape of the cross-section of germanium nanowire is circular, elliptical or prismatic. Said second nanowire is InGaAs nanowire, the shape of the cross-section of the second nanowire is polygon.

Alternatively, in said nanowire semiconductor device, the first nanowire has germanium content in the range of between 65% to 100%. Alternatively, in said nanowire semiconductor device, the dielectric layer is high-k gate dielectric layer. The gate dielectric layer material is $Al_2O_3$ or $TiSiO_x$. The gate electrode layer is a metal electrode layer, the material of the gate electrode layer is TiN, NiAu or anyone of CrAu.

In summary, the present invention provides a method of manufacturing nanowire semiconductor device. In the active region of the PMOS the first nanowire is formed with high hole mobility and in the active region of the NMOS the second nanowire is formed with high electron mobility to achieve the objective of improving the performance of nanowire semiconductor device.

BRIEF DESCRIPTION OF THE DRAWINGS

S10: providing a substrate, said substrate including active region of NMOS and PMOS.

S11: the first selective epitaxial growth process to form a first nanowire having a polygon structure on the NMOS active region.

S12: second selective epitaxial growth process to form a second nanowire having a polygon structure on the PMOS active region.

S13: removing a portion of the substrate through an etching process, such that the first nanowire is suspended above the substrate.

S14: oxidation annealing treatment of the first nanowire.

S15: in the substrate, sequentially forming on the first nanowire and the second nanowire the gate dielectric layer and the gate electrode layer.

DETAILED DESCRIPTION

The following is a detail description with accompanying drawings of an embodiment of the present invention providing the method to manufacture a nanowire semiconductor device. The purposes of the following description are to highlight and clarify the advantages and features of the present invention. It should be noted that the drawings are used in a very simplified form and are using a non-precise proportion, only to facilitate and for the purpose of assisting lucid description of an embodiment of the present invention.

Figure 1:
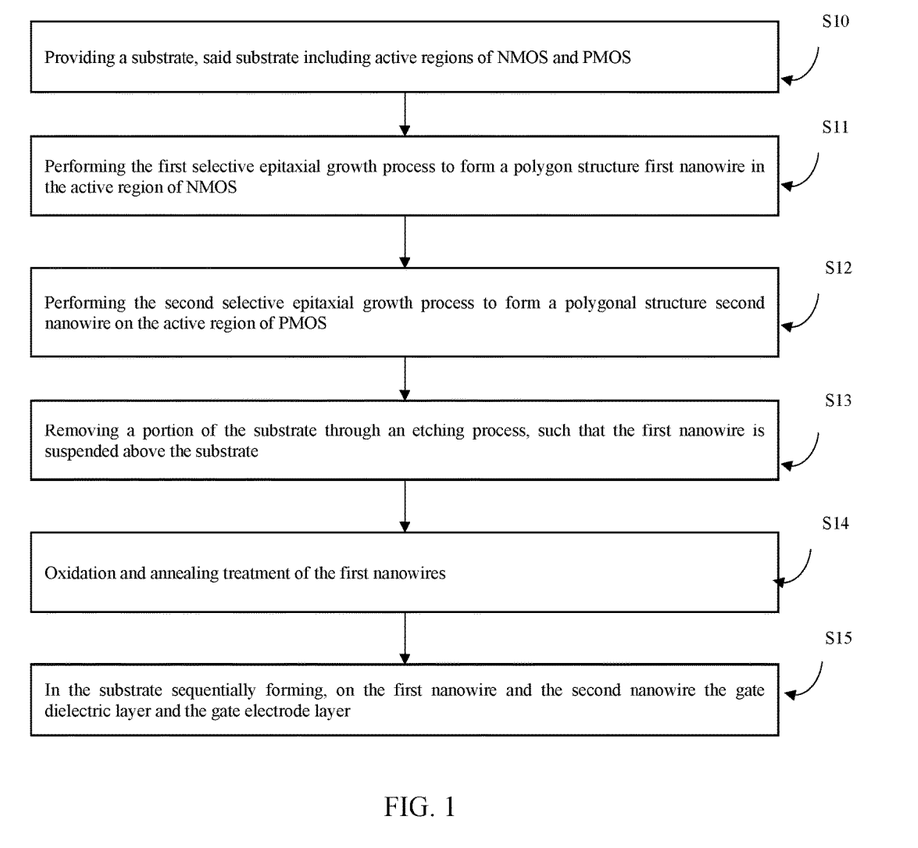
FIG. 1 is a flowchart for an embodiment of the present invention describing the processes of manufacturing a nanowire semiconductor device.

FIG. 1 is a flowchart for an embodiment of the present invention describing the method and procedures of manufacturing a nanowire semiconductor device, comprising:

S10: providing a substrate, said substrate including active regions of NMOS and PMOS;

S11: performing the first selective epitaxial growth process to form a polygon structure first nanowire in the active region of NMOS;

S12: performing the second selective epitaxial growth process to form a polygonal structure second nanowire on the active region of PMOS;

S13: removing a portion of the substrate through an etching process, such that the first nanowire is suspended above the substrate;

S14: oxidation and annealing treatment of the first nanowires;

S15: in the substrate, sequentially forming on the first nanowire and the second nanowire the gate dielectric layer and the gate electrode layer.

Figure 2:
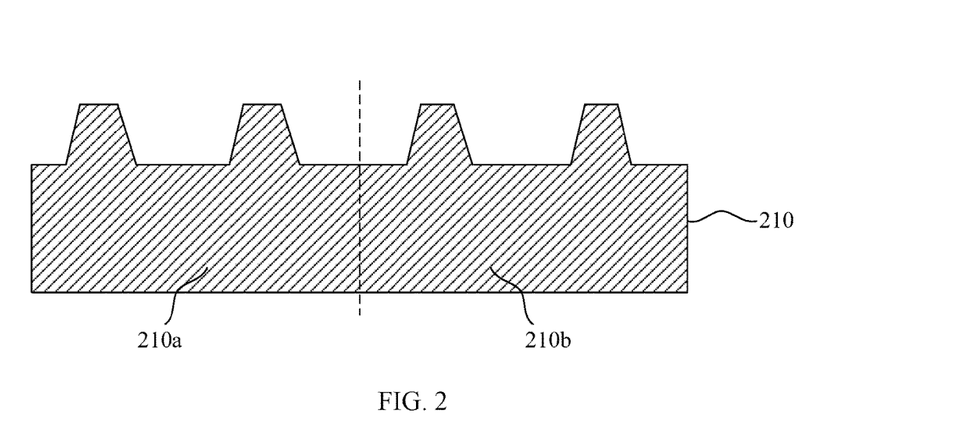
FIGS. 2 to 12 are schematics of the processes of manufacturing a semiconductor nanowire device showing the structural views of an embodiment the present invention.
Figure 3:
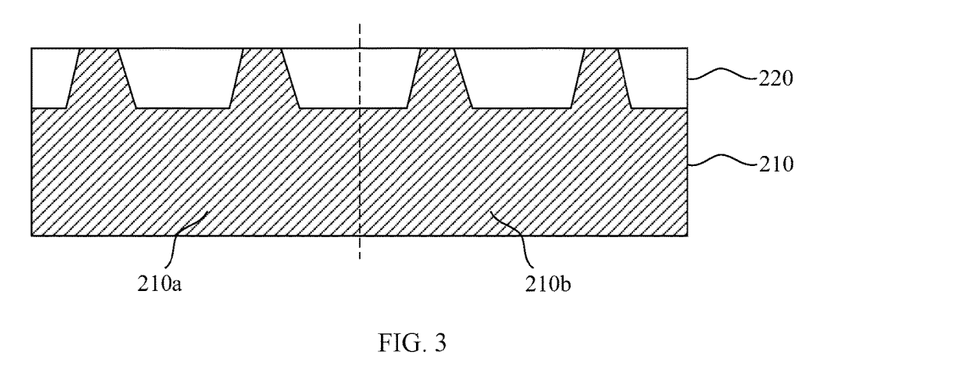

FIGS. 2 to 12 are schematics of the processes of manufacturing an embodiment the present invention a semiconductor nanowire device. FIGS. 2 to 12, in conjunction with FIG. 1, are detailed descriptions of the present invention of the method of manufacturing a nanowire semiconductor device:

firstly, as shown in FIG. 2, providing a substrate 210, said substrate 210 comprises patterned active region 210a of PMOS and active region 210b of NMOS;

subsequently, as shown in FIG. 3, an oxide layer is formed on the substrate 210 and the excessive oxide layer is removed using chemical mechanical polishing to form an isolation structure 220, and the top of the isolation structure 220 is substantially leveling with the top of the substrate 210.

Performing the first selective epitaxial growth process to form a polygon structure in the PMOS active region 210a the first nanowire 240. The processes of formation of a first nanowire 240 comprises:

step one: a first patterned hard mask layer 230 is formed on the substrate 210 and isolation structure 220, the first hard mask layer 230 having a first through hole 230a, the bottom of the first through hole 230a exposing a portion of the substrate 210 of the PMOS active region 210a;

step two: performing the first selective epitaxial growth process to form a first polygonal structure nanowire 240 on the exposed substrate 210 at the bottom of the first through hole 230a;

step three: removing the first hard mask layer 230.

Figure 4:
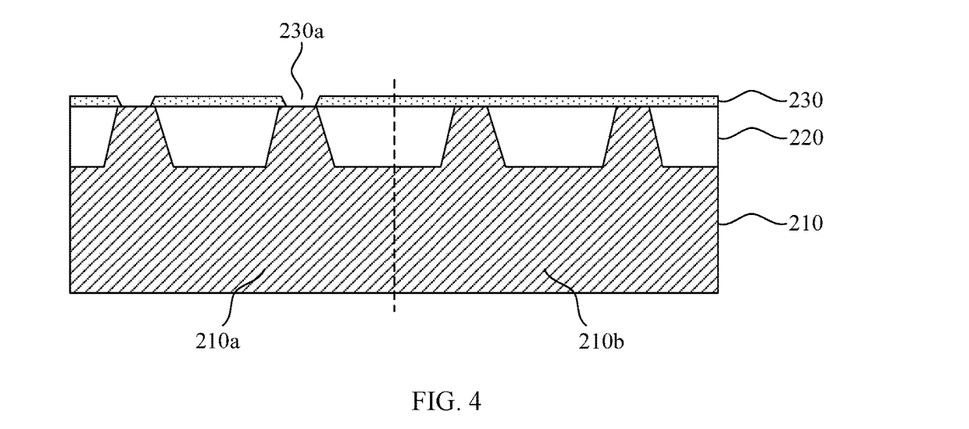

After step one, as shown in FIG. 4, the first patterned hard mask layer 230 is formed on the substrate 210 and the isolation structure 220. A portion of the first hard mask layer 230 covering the active region 210a of PMOS is etched away to form a first through hole 230a. At the bottom of the first through hole 230a the substrate 210 is exposed.

Figure 5:
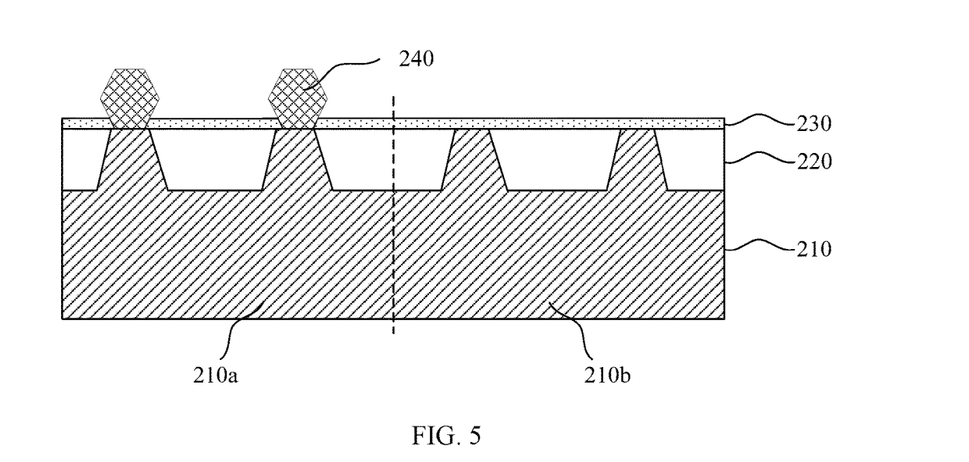

As shown in FIG. 5, after the execution of step two, a polygonal first nanowire 240 is formed. The first nanowire 240 is in contact with the substrate 210 of the PMOS active region 210a.

Thereafter, a second selective epitaxial growth process is performed to form a second polygonal nanowire 260 in the active region 210b of NMOS. The processes of forming the second nanowire 260 comprising:

step one: forming a second patterned hard mask layer 250 on the substrate 210, the isolation structure 220 and the top of the first nanowire 240. At the bottom of the second through hole 250a of the second hard mask layer 250 a portion of the substrate 210 of NMOS active region 210b is exposed;

step two: wet etching the exposed substrate 210 at the bottom of the through hole 250a to form a recess 212 on the exposed substrate 210;

step three: the second selective epitaxial growth process is performed to form a second polygonal nanowire 260 growing from the recess 212;

step four: removing the second hard mask layer 250.

Figure 6:
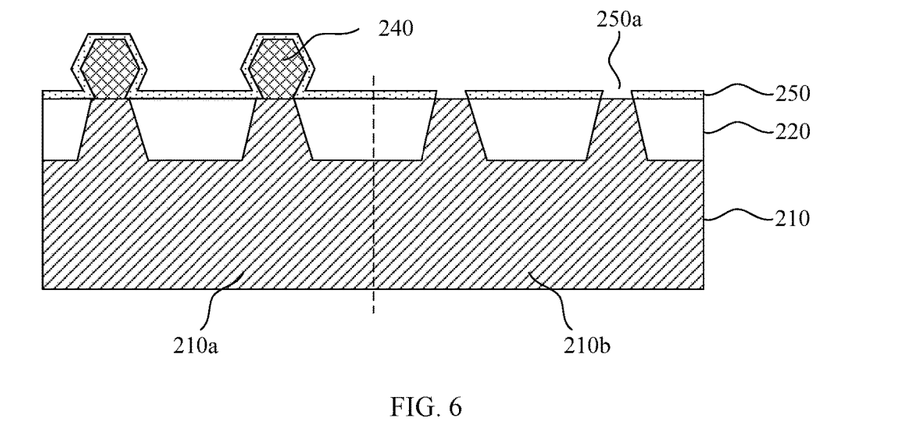

As shown in FIG. 6, after step one, on the substrate 210, the top of the isolation structure 220 and the first nanowire 240, a second patterned hard mask layer 250 is formed. A portion of the hard mask layer 250 located in the NMOS active region 210b is etched away to form a second through hole 250a. The substrate 210 is exposed at the bottom of the second through hole 250a.

Figure 7:
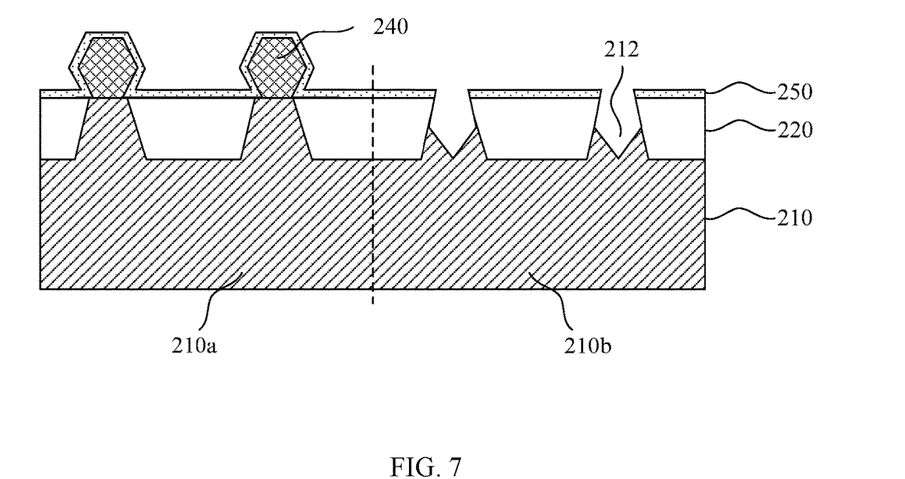

As shown in FIG. 7, a recess 212 is formed by etching the substrate 210 exposed at the bottom of through hole 250a. Preferably, the cross-sectional shape of the recess 212 is V-shaped. The etching solution to use in the etching process is Tetra-Methyl-Ammonium-Hydroxide (TMAH) or KOH.

Figure 8:
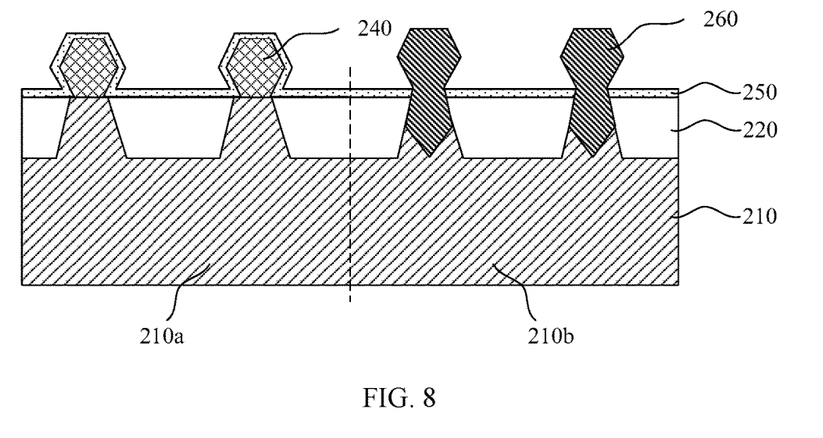

As shown in FIG. 8, after the execution of step three, in the V-shaped recess 212 a second polygonal element nanowire 260 is formed. The second nanowire 260 is in contact with substrate 210 of the active region 210b of NMOS.

Thereafter, a second etching is performed to remove a portion of the isolation structure 220 and the substrate 210 such that the first nanowire 240 is suspended above said substrate 210. The etching solution using in the etching process is Tetra-Methyl-Ammonium-Hydroxide (TMAH).

Figure 9:
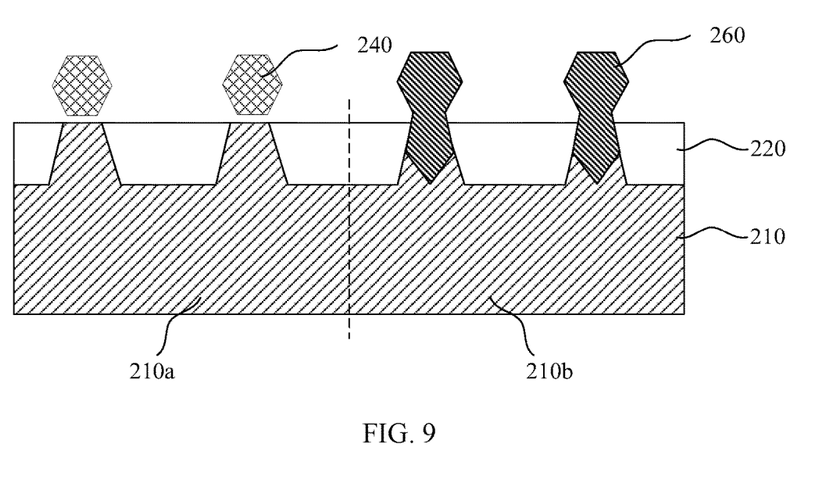

As shown in FIG. 9, after the second etching, the first nanowire 240 is suspended above the substrate 210, i.e., the first nanowire 240 is not in contact with the substrate 210.

Thereafter, the first nanowire 240 is treated with oxidation and annealing. The processes of oxidation and annealing of the first nanowires 240 include:

step one: thermal oxidizing the first nanowire 240;

step two: removing the surface oxide layer of the first nanowire 240 by a wet etching process;

step three: in a hydrogen environment, annealing the first nanowire 240 at high temperature.

Figure 10:
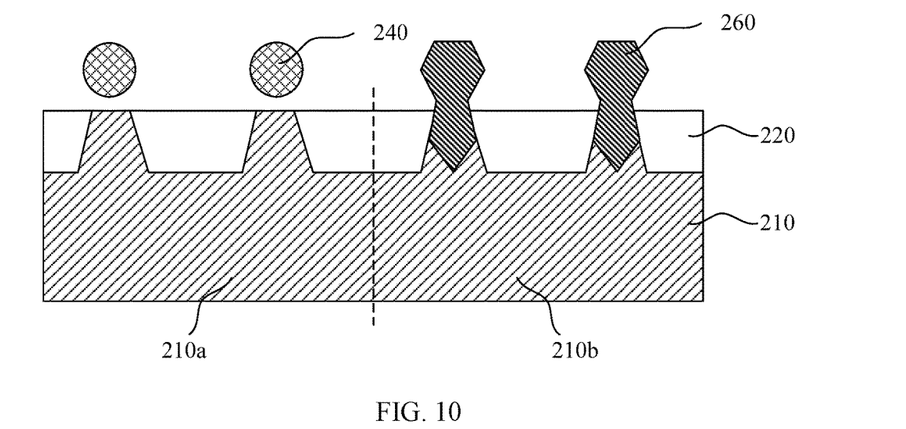

As shown in FIG. 10, during the oxidation and the annealing treatment, germanium silicon is oxidation concentrated, so that the first nanowire 240 formed is a germanium nanowire. The oxidation and wet etching processes smooth the surface of germanium nanowire. After oxidation and annealing treatment, the cross-sectional shape of the polygonal first nanowire 240 (i.e., germanium nanowire) becomes round, elliptical or prismatic.

Finally, sequentially forming on the substrate 210, the first nanowire 240 and the second nanowire 260 the gate dielectric layer 270 and the gate electrode layer 280.

Figure 11:
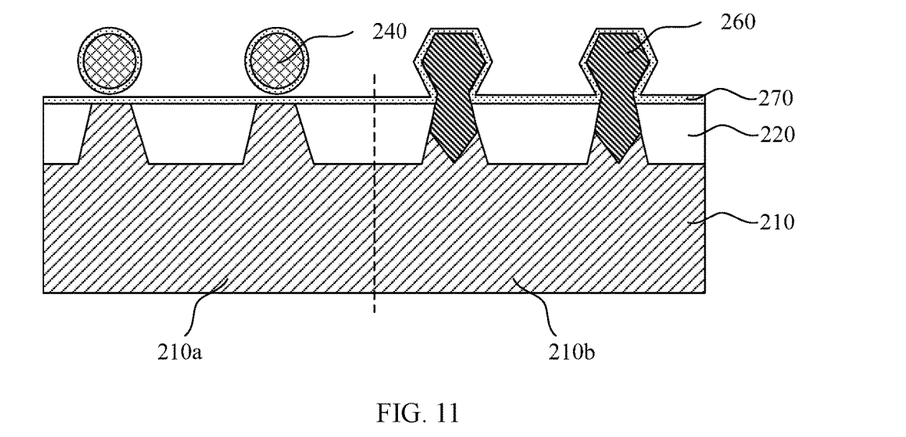

As shown in FIG. 11, forming a gate dielectric layer 270 on the substrate 210, isolation structure 220, the first nanowire 240 and the second nanowire 260. The gate dielectric layer 270 is overlying the substrate 210, the isolation structure surface 220, the first nanowires 240 and the second nanowire 260.

Figure 12:
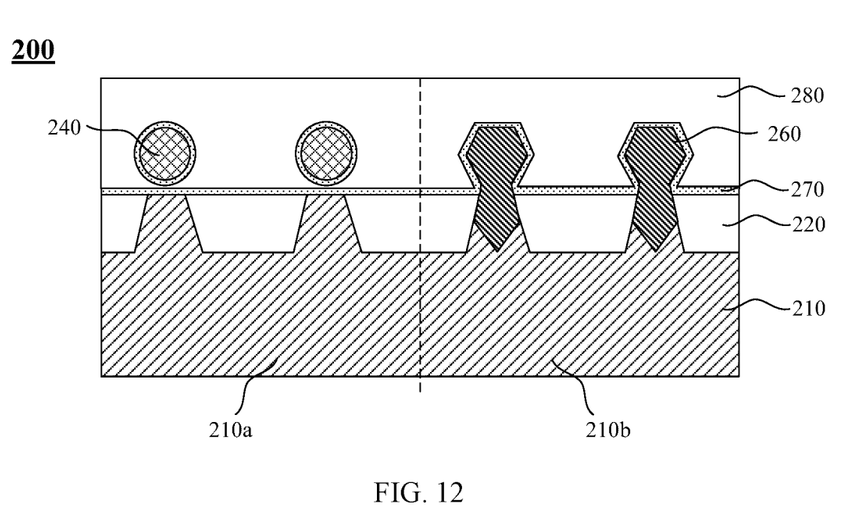

As shown in FIG. 12, a gate electrode layer 280 is formed on the gate dielectric layer 270. The gate electrode layer 280 completely surrounds the first nanowire 240, and surrounding most portion of the surface of the second nanowire 260.

The process of forming the gate dielectric layer 270 may be an atomic layer deposition (ALD) process, metal organic chemical vapor deposition (MOCVD) process, a chemical vapor deposition (CVD) process or other existing technology. The process of forming the gate electrode layer 280 may be an atomic layer deposition (ALD) process, metal organic chemical vapor deposition (MOCVD) process, molecular beam epitaxy (MBE) process or other existing technology.

Thus, a nanowire semiconductor device 200 is formed. Said semiconductor device 200 has a Ge nanowire formed in the active region 210a of the PMOS, an InGaAs nanowire in the active region 210b of NMOS. The germanium (Ge) nanowire has high hole mobility, and the indium gallium arsenide (InGaAs) nanowire has high electron mobility. The performance of the so formed nanowire semiconductor device 200 is significantly improved.

Nanowire formation is the key process in manufacturing nanowire semiconductor devices and is directly related to the performance of the nanowire semiconductor device. Existing process of making germanium nanowires typically includes: first, forming a nanowire having silicon nuclei; then followed by oxidation and annealing treatment to centralize germanium to facilitate the formation of a germanium nanowire. However, the kernel has much higher silicon content, this increases the difficulty of making nanowires with high germanium content. The performance of nanowire semiconductor devices is adversely affected by the nanowire made with low germanium content.

In this embodiment, the germanium nanowire is not formed with a silicon core. The nanowire is formed directly by epitaxial growth of germanium. The germanium nanowire is made following subsequent oxidation and annealing treatment. The nanowire thus formed has high Ge content.

Tests show that the first nanowire 240 of the nanowire semiconductor device 200 has germanium content in the range of between 65% to 100%, which is significantly higher than conventional germanium content of germanium nanowires (typically 50% or less). Thus, using of the method of the present invention to manufacture the nanowire semiconductor device effectively improves the device performance.

Here another embodiment of the present invention of a nanowire semiconductor device is provided. FIG. 12 is a schematic diagram of the structure of a nanowire semiconductor device. The nanowire semiconductor device comprising: a substrate 210, the substrate 210, including active region 210a of PMOS and active region 210b of NMOS; the first nanowire 240 is formed in the active region 210a of PMOS and the second nanowire 260 is formed in the active region 210b of NMOS; The gate dielectric layer 270 and gate electrode layer completely surrounds the first nanowire 240 and partially surrounds the second nanowire 260.

Specifically, the first nanowire 240 and the second nanowires 260 are grown from the substrate 210 of the PMOS active region 210a and the active region 210b of NMOS. The gate dielectric layer 270 is formed on the substrate 210, on the first nanowire 240 and the second nanowire 260. The gate electrode layer 280 is formed on the gate dielectric layer 270. The first nanowire 240 is completely surrounded by the gate dielectric layer 270 and the gate electrode layer 280. A portion of the second nanowire 260 in the region above the isolation structure 220 is also surrounded by the gate dielectric layer 270 and the gate electrode layer 280. Wherein said gate dielectric layer 270 is a high-k dielectric layer. For example, the material of the gate dielectric layer 270 is $Al_2O_3$ or $TiSiO_x$. Using high k material for gate dielectric layer 270 improves the electrical properties of the nanowire semiconductor device. The gate electrode layer 280 is a metal electrode layer, the material of the gate electrode layer 280 is TiN, NiAu or one of CrAu.

The material of said first nanowire 240 and second nanowire 260 is group III-V semiconductor material. The Group III-V semiconductor materials include silicon, silicon germanium, germanium, or silicon carbide. Preferably, the material of the first nanowire 240 is germanium (Ge), the material of the second nanowire 260 is indium gallium arsenide (InGaAs).

The cross-sectional shape of the first nanowire 240 is circular. The cross-sectional shape of the second nanowire 260 is polygonal. Preferably, the polygonal second nanowire 260 has sides equal to or greater than five.

Preferably, the length of the first nanowire 240 is in the range of between 2 nm to 50 nm. The diameter of the first nanowire 240 is in the range of between 2 nm to 5 nm.

In summary, the present invention provides a method of manufacturing nanowire semiconductor device. In the active region of the PMOS the first nanowire is formed with high hole mobility and in the active region of the NMOS the second nanowire is formed with high electron mobility. This achieves the objective of improving the performance of nanowire semiconductor device.

While the present invention has been described in an illustrative manner, it should be understood that the terminology used is intended to be in a nature of words of description rather than of limitation. Many modifications and variations of the present invention and other versions are possible in light of the above teachings, and could be apparent for those skilled in the art. The above described embodiments of the present invention do not limit the present invention in any way. Any person skilled in the art, without departing from the technical scope of the present invention, can modify and vary technical solutions and technical content of the disclosed present invention. The modifications and variations still fall within the scope of the present invention.

What is claimed is:

1. A method for manufacturing a nanowire semiconductor device, the method comprising:
   providing a substrate, said substrate including an active NMOS region and an active PMOS region;
   providing an isolation structure formed on the substrate;
   performing a first selective epitaxial growth process to form a first polygon nanowire structure in the active NMOS region, wherein the first selective epitaxial growth process to form the first polygonal structure nanowire in the active region of NMOS includes:
   forming a first patterned hard mask layer on the substrate having the isolation structure, said first hard mask layer having a first through hole, the bottom of said first through hole exposing a portion of the substrate of active region of NMOS;
   the first selective epitaxial growth process is performed to form a first polygonal structure nanowire on the exposed substrate at the bottom of the first through hole;
   removing the first hard mask layer;
   performing a second selective epitaxial growth process to form a second polygon nanowire structure in the active PMOS region;
   removing a portion of the substrate through an etching process, such that the first nanowire is suspended above the substrate;
   oxidizing and annealing the said first nanowire; and
   on the substrate, sequentially forming a gate dielectric layer and a gate electrode layer on the first nanowire and the second nanowire.

2. A method of manufacturing a nanowire semiconductor device, the method comprising:
   providing a substrate having isolation structure formed on the substrate;
   providing said substrate to include an active NMOS region and an active PMOS region;
   performing a first selective epitaxial growth process to form a first polygon nanowire structure in the active NMOS region;
   performing a second selective epitaxial growth process to form a second polygon nanowire structure in the active PMOS region, wherein the second selective epitaxial growth process performed to form the second polygonal structure nanowire in the active region of PMOS including:
   forming a second patterned hard mask layer on the substrate, the isolation structure and the first nanowire, said second hard mask layer having a second via hole, the bottom of said second via hole exposing a portion of the substrate of the PMOS active region;
   wet etching the substrate exposed at the bottom of the second through hole to form a recess, wherein the second selective epitaxial growth process is performed to form the second polygonal structure nanowire on said recess;
   removing the second hard mask layer;
   removing a portion of the substrate through an etching process, such that the first nanowire is suspended above the substrate;
   oxidizing and annealing the said first nanowire; and
   on the substrate, sequentially forming a gate dielectric layer and a gate electrode layer on the first nanowire and the second nanowire.

3. A method of manufacturing a nanowire semiconductor device according to claim 1, characterized in that the process of oxidation and annealing is performed on the first nanowire comprising:
   thermal oxidizing said first nanowire;
   the surface oxide layer of said first nanowire is removed by wet etching process; and high temperature annealing of said first nanowire in a hydrogen environment.

4. The method of manufacturing a nanowire semiconductor device according to claim 1, characterized in that materials of the first nanowire and the second nanowire are group III-V semiconductor material.

5. The method for manufacturing a nanowire semiconductor device according to claim 1, wherein material of said first nanowire is germanium, the material of the second nanowire is indium gallium arsenide.

* * * * *